United States Patent
Nishida et al.

(10) Patent No.: US 11,456,213 B2
(45) Date of Patent: Sep. 27, 2022

(54) PROCESSING METHOD OF WAFER

(71) Applicant: DISCO CORPORATION, Tokyo (JP)

(72) Inventors: Yoshiteru Nishida, Tokyo (JP); Hidekazu Iida, Tokyo (JP); Kenta Chito, Tokyo (JP)

(73) Assignee: DISCO CORPORATION, Tokyo (JP)

(*) Notice: Subject to any disclaimer, the term of this patent is extended or adjusted under 35 U.S.C. 154(b) by 141 days.

(21) Appl. No.: 17/017,230

(22) Filed: Sep. 10, 2020

(65) Prior Publication Data

US 2021/0082763 A1    Mar. 18, 2021

(30) Foreign Application Priority Data

Sep. 12, 2019  (JP) .............................. JP2019-166093

(51) Int. Cl.
| | | |
|---|---|---|
| *H01L 21/78* | (2006.01) | |
| *H01L 21/268* | (2006.01) | |
| *H01L 21/3065* | (2006.01) | |
| *H01L 23/544* | (2006.01) | |
| *H01L 21/304* | (2006.01) | |

(52) U.S. Cl.
CPC ............ *H01L 21/78* (2013.01); *H01L 21/268* (2013.01); *H01L 21/304* (2013.01); *H01L 21/3065* (2013.01); *H01L 23/544* (2013.01); *H01L 2223/5446* (2013.01)

(58) Field of Classification Search
CPC ........... H01L 21/78–786; H01L 21/302; H01L 21/304; H01L 21/3043; H01L 21/02013; H01L 21/463; H01L 21/02076; H01L 21/0209; H01L 21/6835; H01L 21/6836; B23K 26/00–70

See application file for complete search history.

(56) References Cited

U.S. PATENT DOCUMENTS

2015/0072506 A1*  3/2015  Nomaru ................ H01L 21/304
                                                                                438/462
2017/0162521 A1*  6/2017  Nakamura ............ H01L 21/268

FOREIGN PATENT DOCUMENTS

JP        2003173987 A      6/2003
KR       20120023258 A      3/2012

OTHER PUBLICATIONS

Search report issued in counterpart Singapore patent application No. 10202008650U, dated Jul. 22, 2021.

* cited by examiner

*Primary Examiner* — Julio J Maldonado
*Assistant Examiner* — Stanetta D Isaac
(74) *Attorney, Agent, or Firm* — Greer Burns & Crain Ltd.

(57) ABSTRACT

There is provided a processing method of a wafer having a functional layer on a front surface side. The processing method includes a laser processing step of forming laser processed grooves along streets while removing the functional layer along the streets by executing irradiation with a laser beam and a cut groove forming step of forming cut grooves inside the laser processed grooves along the streets by cutting the wafer by a cutting blade. The processing method also includes a grinding step of causing the cut grooves to be exposed on a back surface side of the wafer and dividing the wafer into plural device chips by grinding the back surface side of the wafer and thinning the wafer and a processing distortion removal step of supplying a gas in a plasma state to the back surface side of the wafer and removing processing distortion.

3 Claims, 9 Drawing Sheets

PROCESSING METHOD OF WAFER

BACKGROUND OF THE INVENTION

Field of the Invention

The present invention relates to a processing method of a wafer having a functional layer that forms plural devices.

Description of the Related Art

In a manufacturing step of device chips, a wafer is used on which a device such as an integrated circuit (IC) or large scale integration (LSI) is formed on a front surface side of each of plural regions marked out by plural streets (planned dividing lines) arranged in a lattice manner. Plural device chips each including the device are obtained by dividing this wafer along the streets. The device chips are mounted in various pieces of electronic equipment typified by mobile phones and personal computers.

In recent years, in association with reduction in the size and thickness of the electronic equipment, the device chips have also been required to have reduced thickness. Thus, before dividing of a wafer, a step of thinning the wafer by grinding a back surface side of the wafer is executed in some cases. By dividing the wafer after grinding and thinning the wafer, device chips with reduced thickness are obtained.

Furthermore, as a method for dividing a wafer into plural device chips while thinning the wafer, a process called dicing before grinding (DBG) has been proposed (for example, refer to Japanese Patent Laid-Open No. 2003-173987). In the DBG process, first, a cutting blade is made to cut into the front surface side of the wafer and cut grooves with a depth smaller than the thickness of the wafer are formed along streets (half cut). Thereafter, the back surface side of the wafer is ground and the wafer is thinned until the cut grooves are exposed on the back surface side of the wafer. Thereby, the wafer is divided into plural device chips. When this DBG process is used, effects that the occurrence of a defect (chipping) on the back surface side of the wafer is suppressed, and so forth, are obtained.

SUMMARY OF THE INVENTION

When a wafer is divided, part of a layer (functional layer) including various films (insulating film, electrically-conductive film, and so forth) that form devices remains on streets of the wafer in some cases. When this wafer is cut along the street by a cutting blade, the functional layer gets caught by the cutting blade that rotates and is separated in some cases. Furthermore, possibly the device breaks if this separation of the functional layer reaches the device from on the street. Thus, in some cases, a method is used in which the functional layer that remains on the streets is removed by irradiation with a laser beam before the wafer is cut by the cutting blade. Specifically, first, the functional layer is removed along the streets by irradiating the front surface side of the wafer with the laser beam along the streets. Thereafter, the wafer is cut along the streets by the cutting blade and the wafer is divided. When this method is used, the wafer is cut by the cutting blade in the state in which the functional layer has been removed from on the streets. For this reason, the contact between the cutting blade and the functional layer is avoided and breakage of the device due to separation of the functional layer is prevented.

However, when the irradiation with the laser beam is executed along the streets, laser processed grooves are formed in the wafer along the streets. Furthermore, around the laser processed grooves, distortion of minute unevenness, cracks, and so forth is formed due to influence of heat generated by the irradiation with the laser beam. There is a problem that, when the wafer including a region in which this distortion is formed (heat affected layer) is divided into plural device chips, the heat affected layer remains in the device chips and a flexural strength (bending strength) of the device chips lowers.

The present invention is made in view of such a problem and intends to provide a processing method of a wafer that can suppress the lowering of the flexural strength of device chips.

In accordance with an aspect of the present invention, there is provided a processing method of a wafer having, on a front surface side, a functional layer that forms a plurality of devices disposed in a plurality of regions marked out by a plurality of streets. The processing method includes a laser processing step of forming laser processed grooves along the streets while removing the functional layer along the streets by irradiating the front surface side of the wafer with a laser beam having absorbability with respect to the wafer along the streets and a cut groove forming step of forming cut grooves with a depth that exceeds finished thickness of the wafer inside the laser processed grooves along the streets by cutting the front surface side of the wafer along the streets by a cutting blade thinner than width of the laser processed grooves. The processing method also includes a protective component sticking step of sticking a protective component to the front surface side of the wafer after execution of the cut groove forming step, a grinding step of causing the cut grooves to be exposed on a back surface side of the wafer to divide the wafer into a plurality of device chips by holding the wafer by a chuck table of a grinding apparatus with intermediary of the protective component and grinding the back surface side of the wafer to thin the wafer until thickness of the wafer becomes the finished thickness, and a processing distortion removal step of supplying a gas in a plasma state to the back surface side of the wafer and removing processing distortion formed in the back surface side and side parts of the plurality of device chips. A heat affected layer formed around the laser processed grooves is removed in the processing distortion removal step.

In accordance with another aspect of the present invention, there is provided a processing method of a wafer having, on a front surface side, a functional layer that forms a plurality of devices disposed in a plurality of regions marked out by a plurality of streets. The processing method includes a laser processing step of forming laser processed grooves with a depth that exceeds finished thickness of the wafer along the streets while removing the functional layer along the streets by irradiating the front surface side of the wafer with a laser beam having absorbability with respect to the wafer along the streets and a protective component sticking step of sticking a protective component to the front surface side of the wafer after execution of the laser processing step. The processing method also includes a grinding step of causing the laser processed grooves to be exposed on a back surface side of the wafer to divide the wafer into a plurality of device chips by holding the wafer by a chuck table of a grinding apparatus with intermediary of the protective component and grinding the back surface side of the wafer to thin the wafer until thickness of the wafer becomes the finished thickness, and a processing distortion removal step of supplying a gas in a plasma state to the back surface side of the wafer and removing processing distortion formed in the back surface side and side parts of the plurality of device chips. A heat affected layer formed around the laser processed grooves is removed in the processing distortion removal step.

In accordance with another aspect of the present invention, there is provided a processing method of a wafer having, on a front surface side, a functional layer that forms a plurality of devices disposed in a plurality of regions marked out by a plurality of streets. The processing method includes a laser processing step of forming laser processed grooves along the streets to divide the wafer into a plurality of device chips while removing the functional layer along the streets by executing irradiation with a laser beam having absorbability with respect to the wafer along the streets, a protective component sticking step of sticking a protective component to the front surface side of the wafer after execution of the laser processing step, and a heat affected layer removal step of supplying a gas in a plasma state to a back surface side of the wafer and removing a heat affected layer formed around the laser processed grooves after execution of the protective component sticking step.

In the processing method of a wafer according to the aspect of the present invention, the heat affected layer formed around the laser processed grooves is removed by supplying the gas in the plasma state to the wafer divided into the plural device chips through the formation of the laser processed grooves by the irradiation with the laser beam. This can prevent the heat affected layer from remaining in the device chips and suppress the lowering of the flexural strength of the device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
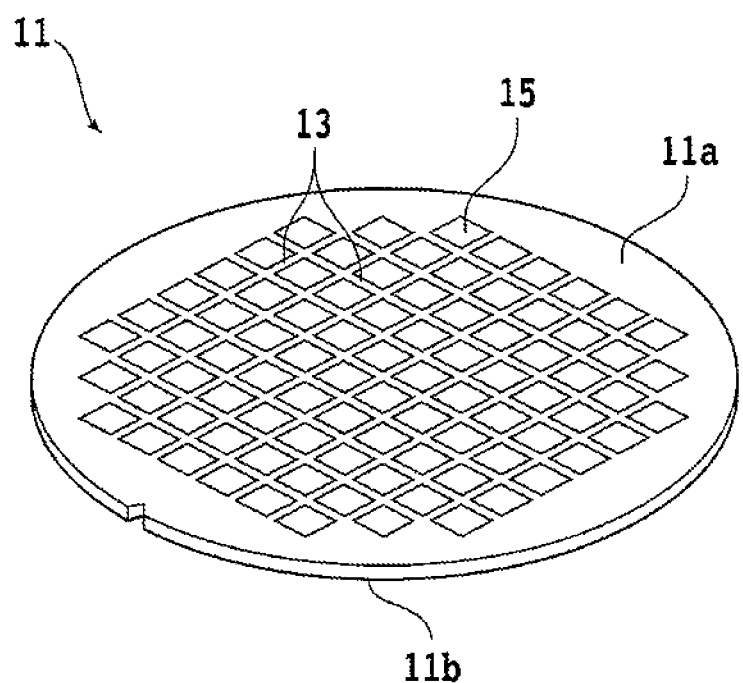
FIG. 1A is a perspective view depicting a wafer.

An embodiment of the present invention will be described below with reference to the accompanying drawings. First, a configuration example of a wafer that can be processed by a processing method of a wafer according to the present embodiment will be described. FIG. 1A is a perspective view depicting a wafer 11 and FIG. 1B is a sectional view depicting the wafer 11.

For example, the wafer 11 is formed into a circular disc shape with silicon or the like and has a front surface 11a and a back surface 11b. Furthermore, the wafer 11 is segmented into plural rectangular regions by plural streets (planned dividing lines) 13 arranged in a lattice manner, and a device 15 such an IC or LSI is formed in each of these plural regions. There is no limit on the material, shape, structure, size, and so forth of the wafer 11. For example, the wafer 11 may be a substrate that is composed of a material such as a semiconductor other than silicon (GaAs, InP, GaN, SiC, or the like), ceramic, resin, or metal and has an optional size and shape. In addition, there is no limit also on the kind, quantity, shape, structure, size, arrangement, and so forth of the devices 15 formed on the wafer 11.

Figure 1B:
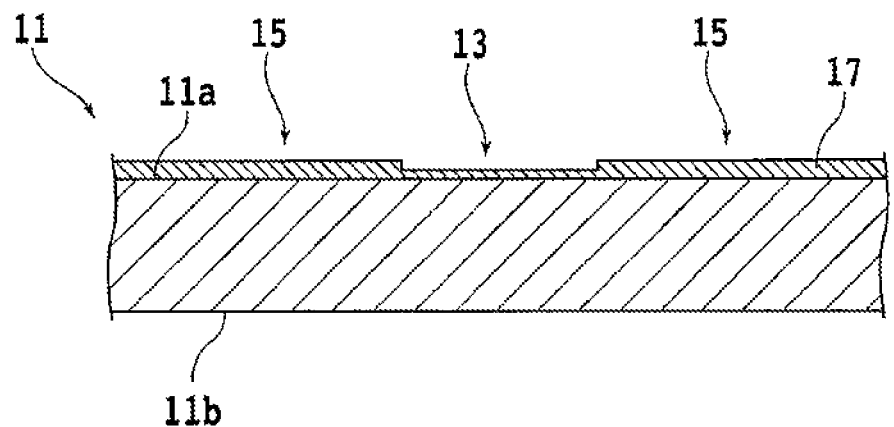
FIG. 1B is a sectional view depicting the wafer.

As depicted in FIG. 1B, a functional layer (device layer) 17 that forms the plural devices 15 is formed on the side of the front surface 11a of the wafer 11. The functional layer 17 is a layer including various films (insulating film, electrically-conductive film, and so forth) that form the devices 15. For example, the functional layer 17 includes an electrically-conductive film that forms electrodes and interconnects of the devices 15 and insulating films such as a low dielectric constant insulating film (Low-k film) that forms an interlayer insulating film of the devices 15 and a passivation film that protects the devices 15. The regions marked out by the streets 13 in the functional layer 17 each correspond to the device 15.

When the wafer 11 is cut along the streets 13, the wafer 11 is divided into plural device chips each including the device 15. For the dividing of the wafer 11, for example, a cutting apparatus that cuts the wafer 11 by an annular cutting blade is used. The cutting apparatus includes a chuck table that holds the wafer 11 and a cutting unit on which the cutting blade that cuts the wafer 11 is mounted. The cutting blade is rotated and is made to cut into the wafer 11 held by the chuck table along the street 13 and thereby the wafer 11 is cut along the street 13. Furthermore, when the wafer 11 is cut along all streets 13, the wafer 11 is divided into the plural device chips.

However, as depicted in FIG. 1B, part of the functional layer 17 is formed also on the street 13 of the wafer 11. Furthermore, when the cutting blade is made to cut into the wafer 11 along the street 13, the functional layer 17 that remains on the street 13 gets caught by the cutting blade that rotates and is separated in some cases. For example, when the Low-k film included in the functional layer 17 remains on the street 13, this Low-k film is easily peeled by the cutting blade. Furthermore, when the separation of the functional layer 17 reaches the device 15, possibly the device 15 breaks.

Figure 2A:
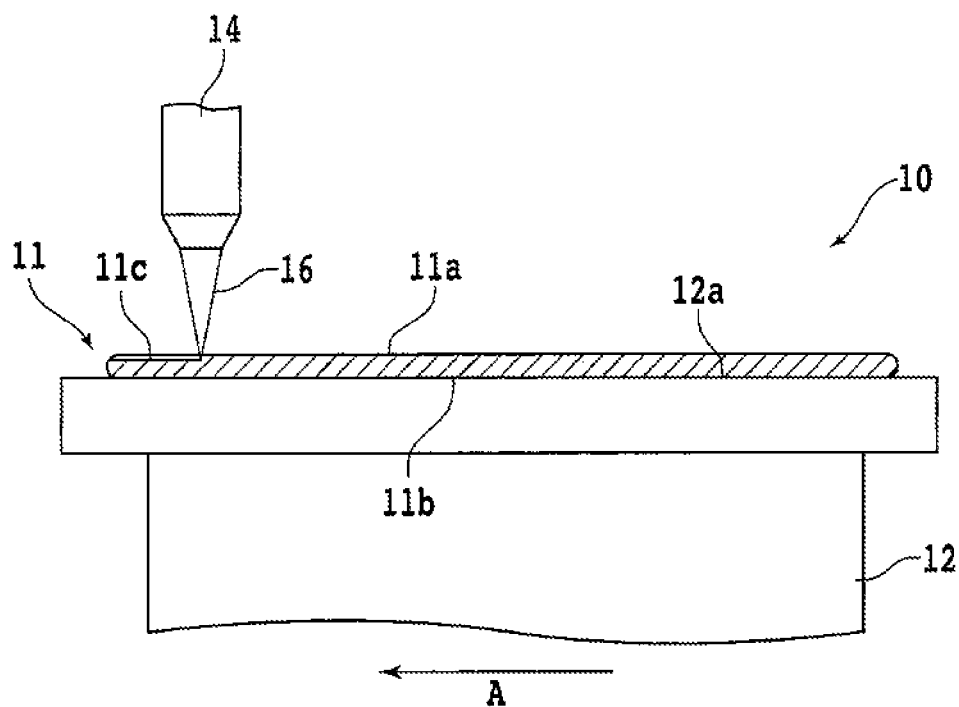
FIG. 2A is a partially sectional front view depicting the wafer in a laser processing step.

Thus, in the processing method of a wafer according to the present embodiment, first, by irradiating the side of the front surface 11a of the wafer 11 with a laser beam along the streets 13, laser processed grooves are formed along the streets 13 while the functional layer 17 is removed along the streets 13 (laser processing step). FIG. 2A is a partially sectional front view depicting the wafer 11 in the laser processing step. In the laser processing step, the wafer 11 is irradiated with the laser beam by using a laser processing apparatus 10. The laser processing apparatus 10 includes a chuck table (holding table) 12 that holds the wafer 11 and a laser irradiation unit 14 that emits a laser beam 16 toward the wafer 11 held by the chuck table 12.

The upper surface of the chuck table 12 forms a holding surface 12a that holds the wafer 11. For example, the holding surface 12a is formed into a circular shape with a diameter larger than the wafer 11. However, the shape of the holding surface 12a is not limited and is set as appropriate according to the shape of the wafer 11. Furthermore, the holding surface 12a is connected to a suction source (not depicted) such as an ejector through a flow path (not depicted) formed inside the chuck table 12. There is no limit on the kind and structure of the chuck table that holds the wafer 11. For example, a chuck table that holds the wafer 11 by a mechanical method, electrical method, or the like may be used instead of the chuck table 12.

A movement mechanism (not depicted) and a rotation mechanism (not depicted) are connected to the chuck table 12. The movement mechanism moves the chuck table 12 along a processing feed direction (first horizontal direction) and an indexing feed direction (second horizontal direction) that are perpendicular to each other. Furthermore, the rotation mechanism rotates the chuck table 12 around a rotation axis substantially parallel to the vertical direction (upward-downward direction).

The laser irradiation unit 14 is disposed above the chuck table 12. The laser irradiation unit 14 emits the laser beam 16 for processing the wafer 11 toward the wafer 11 held by the chuck table 12. Specifically, the laser irradiation unit 14 includes a laser oscillator of a YAG laser, $YVO_4$ laser, or the like and a light collector that causes a laser beam oscillated in a pulsed manner by the laser oscillator to be collected at a predetermined position. The wavelength of the laser beam 16 is set in such a manner that at least part of the laser beam 16 is absorbed by the wafer 11 (laser beam 16 has absorbability with respect to the wafer 11). Furthermore, the irradiation condition (power, spot diameter, repetition frequency, and so forth) of the laser beam 16 is set in such a manner that ablation processing is executed for the wafer 11 when the wafer 11 is irradiated with the laser beam 16.

In the laser processing step, first, the wafer 11 is held by the chuck table 12. Specifically, the wafer 11 is disposed on the chuck table 12 in such a manner that the side of the front surface 11a (side of the functional layer 17, see FIG. 1B) is exposed upward and the side of the back surface 11b is opposed to the holding surface 12a. When a negative pressure of the suction source is made to act on the holding surface 12a in this state, the wafer 11 is sucked and held by the chuck table 12. A protective tape or the like that protects the wafer 11 may be stuck to the side of the back surface 11b of the wafer 11.

Next, the chuck table 12 is rotated in such a manner that the length direction of one street 13 (see FIG. 1A) becomes substantially parallel to the processing feed direction. Furthermore, the position of the chuck table 12 is adjusted in such a manner that the light focal point of laser beam 16 is positioned on an extension line of the one street 13. Moreover, the height of the light focal point of the laser beam 16 is adjusted in such a manner that the laser beam 16 is collected on the side of the front surface 11a of the wafer 11.

Then, as depicted in FIG. 2A, the chuck table 12 is moved along the processing feed direction (direction illustrated by arrow A) while irradiation with the laser beam 16 from the laser irradiation unit 14 is executed. Thereby, the side of the front surface 11a of the wafer 11 is irradiated with the laser beam 16 along the one street 13 and ablation processing is executed for the wafer 11.

When the side of the front surface 11a of the wafer 11 is irradiated with the laser beam 16, the functional layer 17 (see FIG. 1B) is removed along the one street 13. In addition, a laser processed groove 11c with a predetermined depth is formed into a line shape on the side of the front surface 11a of the wafer 11 along the one street 13. The functional layer 17 may be removed by ablation based on the irradiation with the laser beam 16 or may be removed as the result of the formation of the laser processed groove 11c in the wafer 11.

Figure 2B:
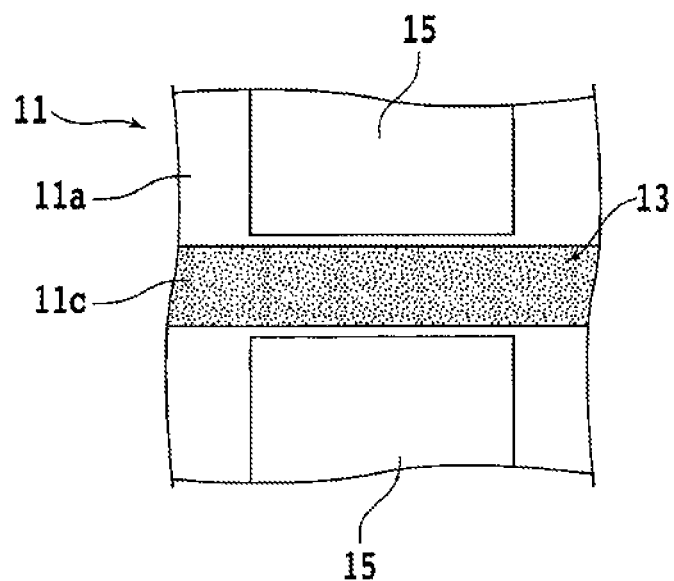
FIG. 2B is an enlarged plan view depicting part of the wafer in which a laser processed groove is formed.

FIG. 2B is an enlarged plan view depicting part of the wafer 11 in which the laser processed groove 11c is formed. When the wafer 11 is irradiated with the laser beam 16 along the street 13, the linear laser processed groove 11c with a smaller width than the width of the street 13 (interval between adjacent devices 15) is formed in the wafer 11 along the street 13. The width of the laser processed groove 11c is adjusted by controlling the spot diameter of the laser beam 16, for example. In FIG. 2B, the region in which the laser processed groove 11c is formed is given a pattern. Although diagrammatic representation is omitted in FIG. 2B, the functional layer 17 (see FIG. 1B) is removed in the region that overlaps with the laser processed groove 11c by the irradiation with the laser beam 16.

Thereafter, the same procedure is repeated to remove the functional layer 17 along all streets 13 and form the laser processed grooves 11c. Thereby, the laser processed grooves 11c are formed in a lattice manner on the side of the front surface 11a of the wafer 11. In the laser processing step, irradiation with the laser beam 16 may be executed plural times along each street 13.

Furthermore, in the laser processing step, a protective film may be formed on the side of the front surface 11a of the wafer 11 before the wafer 11 is irradiated with the laser beam 16. When the protective film is formed on the side of the front surface 11a of the wafer 11 and the wafer 11 is irradiated with the laser beam 16 through this protective film, processing dust (debris) generated due to the irradiation with the laser beam 16 can be prevented from adhering to the side of the front surface 11a of the wafer 11. This protective film is removed after the formation of the laser processed grooves 11c is completed. As the protective film, for example, a water-soluble resin such as polyvinyl alcohol (PVA) or polyethylene glycol (PEG) can be used. When the protective film is composed of the water-soluble resin, the protective film can be easily removed by supplying purified water or the like to the side of the front surface 11a of the wafer 11.

Figure 3A:
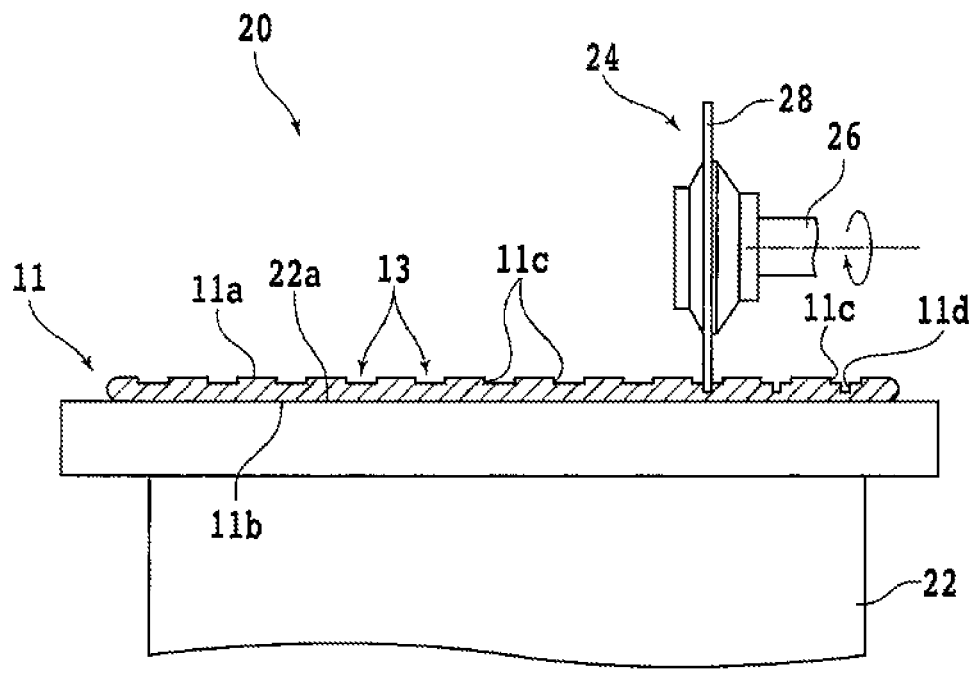
FIG. 3A is a partially sectional front view depicting the wafer in a cut groove forming step.

Next, cut grooves are formed inside the laser processed grooves 11c along the streets 13 by cutting the side of the front surface 11a of the wafer 11 by a cutting blade along the streets 13 (cut groove forming step). FIG. 3A is a partially sectional front view depicting the wafer 11 in the cut groove forming step. In the cut groove forming step, the wafer 11 is cut by using a cutting apparatus 20. The cutting apparatus 20 includes a chuck table (holding table) 22 that holds the wafer 11 and a cutting unit 24 that cuts the wafer 11 held by the chuck table 22.

The upper surface of the chuck table 22 forms a holding surface 22a that holds the wafer 11. For example, the holding surface 22a is formed into a circular shape with a larger diameter than the wafer 11. However, the shape of the holding surface 22a is not limited and is set as appropriate according to the shape of the wafer 11. Furthermore, the holding surface 22a is connected to a suction source (not depicted) such as an ejector through a flow path (not depicted) formed inside the chuck table 22. There is no limit on the kind and structure of the chuck table that holds the wafer 11. For example, a chuck table that holds the wafer 11 by a mechanical method, electrical method, or the like may be used instead of the chuck table 22.

A movement mechanism (not depicted) and a rotation mechanism (not depicted) are connected to the chuck table 22. The movement mechanism moves the chuck table 22 along a processing feed direction (front-rear direction in FIG. 3A). Furthermore, the rotation mechanism rotates the chuck table 22 around a rotation axis substantially parallel to the vertical direction.

The cutting unit 24 is disposed above the chuck table 22. The cutting unit 24 includes a circular cylindrical spindle 26 disposed along a direction that is substantially parallel to the holding surface 22a and is substantially perpendicular to the processing feed direction. An annular cutting blade 28 that cuts the wafer 11 is mounted on the tip part (one end part) of the spindle 26. The cutting blade 28 is formed of an electroformed abrasive stone obtained by fixing diamond abrasive grains by nickel plating, for example. A rotational drive source (not depicted) such as a motor is connected to the base end part (the other end part) of the spindle 26. When the spindle 26 is rotated by this rotational drive source, the cutting blade 28 mounted on the spindle 26 rotates.

Furthermore, a movement mechanism (not depicted) is connected to the cutting unit 24. The movement mechanism moves the cutting unit 24 along an indexing feed direction (left-right direction in FIG. 3A) and the vertical direction. By this movement mechanism, the position of the cutting blade 28 in the indexing feed direction and the height of the cutting blade 28 (cutting-in depth) are adjusted.

In the cut groove forming step, first, the wafer 11 is held by the chuck table 22. Specifically, the wafer 11 is disposed on the chuck table 22 in such a manner that the side of the front surface 11a is exposed upward and the side of the back surface 11b is opposed to the holding surface 22a. When a negative pressure of the suction source is made to act on the holding surface 22a in this state, the wafer 11 is sucked and held by the chuck table 22. A protective tape or the like that protects the wafer 11 may be stuck to the side of the back surface 11b of the wafer 11.

Next, the chuck table 22 is rotated in such a manner that the length direction of one street 13 becomes substantially parallel to the processing feed direction. Furthermore, the height of the cutting unit 24 is adjusted in such a manner that the lower end of the cutting blade 28 is disposed to the lower side relative to the bottom of the laser processed groove 11c and the upper side relative to the back surface 11b of the wafer 11. Moreover, the position of the cutting unit 24 in the indexing feed direction is adjusted in such a manner that the cutting blade 28 is disposed on an extension line of the one street 13. In this state, the chuck table 22 is moved along the processing feed direction while the cutting blade 28 is rotated. Thereby, the cutting blade 28 cuts into the side of the front surface 11a of the wafer 11 along the street 13 and a linear cut groove 11d is formed in the wafer 11 along the street 13.

In the cut groove forming step, the cutting blade 28 thinner (with a smaller width) than the width of the laser processed groove 11c formed in the wafer 11 is used. Furthermore, the cutting blade 28 moves in such a manner that the whole thereof overlaps with the laser processed groove 11c in plan view and passes between both ends of the laser processed groove 11c in the width direction (inside the laser processed groove 11c). Thus, the cutting blade 28 cuts into the bottom of the laser processed groove 11c without getting contact with a pair of side surfaces of the wafer 11 exposed inside the laser processed groove 11c. As a result, the cut groove 11d with a smaller width than the laser processed groove 11c is formed inside the laser processed groove 11c in plan view from the bottom of the laser processed groove 11c toward the side of the back surface 11b of the wafer 11. Moreover, the cutting-in depth of the cutting blade 28 (difference in the height between the front surface 11a of the wafer 11 and the lower end of the cutting blade 28) is set to exceed the thickness of the wafer 11 after the wafer 11 is ground in a grinding step to be described later (finished thickness of the wafer 11), i.e., the target value of the thickness of the wafer 11 in the grinding step. Thus, the depth of the cut groove 11d (difference in the height between the front surface 11a of the wafer 11 and the bottom of the cut groove 11d) becomes larger than the finished thickness of the wafer 11.

Figure 3B:
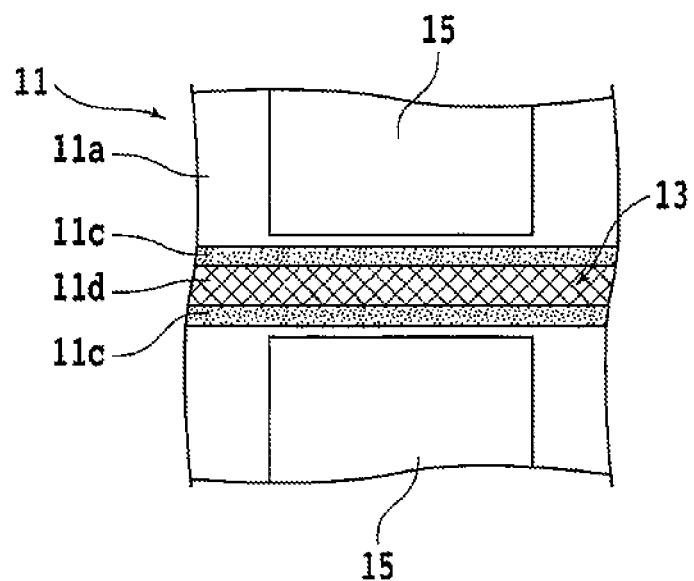
FIG. 3B is an enlarged plan view depicting part of the wafer in which a cut groove is formed.

FIG. 3B is an enlarged plan view depicting part of the wafer 11 in which the cut groove 11d is formed. When the wafer 11 is cut by the cutting blade 28 along the street 13, on the street 13, the cut groove 11d with a smaller width than the width of the laser processed groove 11c is formed inside the laser processed groove 11c along the street 13. In FIG. 3B, the region in which the cut groove 11d is formed is given a different pattern from the region in which the laser processed groove 11c is formed. Here, in the above-described laser processing step, the functional layer 17 (see FIG. 1B) has been removed in the regions that overlap with the laser processed groove 11c. For this reason, contact between the cutting blade 28 and the functional layer 17 does not occur when the inside of the laser processed groove 11c is cut by the cutting blade 28. This can prevent the functional layer 17 from getting caught by the cutting blade 28 that rotates and being separated.

Thereafter, the same procedure is repeated to form the cut grooves 11d along all streets 13. Thereby, on the side of the front surface 11a of the wafer 11, the cut grooves 11d with the depth that exceeds the finished thickness of the wafer 11 are formed in a lattice manner along the streets 13.

Figure 4A:
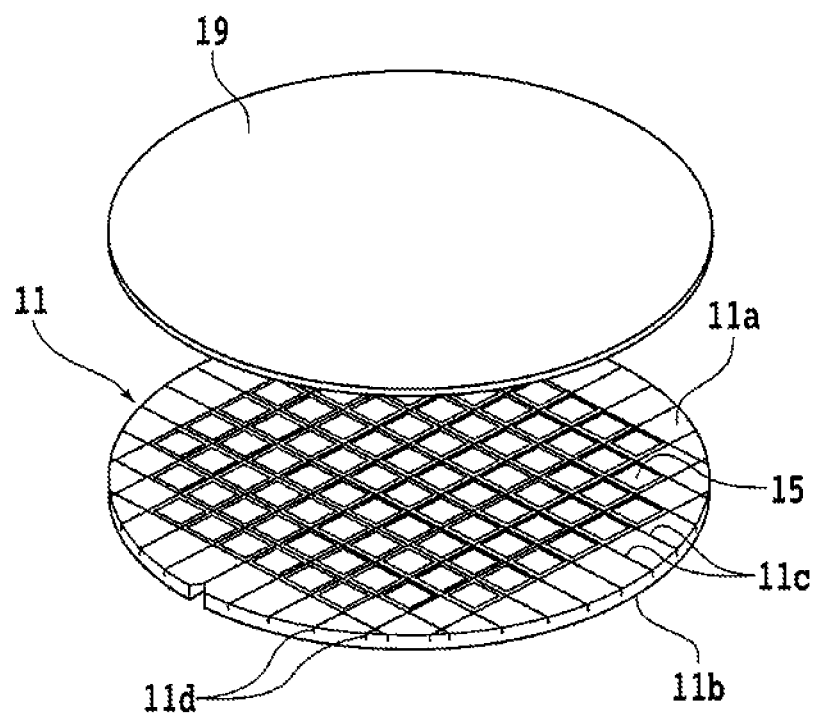
FIG. 4A is a perspective view depicting the wafer in a protective component sticking step.

Next, a protective component is stuck to the side of the front surface 11a of the wafer 11 (protective component sticking step). FIG. 4A is a perspective view depicting the wafer 11 in the protective component sticking step. In the protective component sticking step, for example, a protective component 19 formed into a circular shape with a diameter equivalent to that of the wafer 11 is stuck to the side of the front surface 11a of the wafer 11. The protective component 19 is stuck to the wafer 11 in such a manner as to cover the whole of the side of the front surface 11a of the wafer 11.

As the protective component 19, a protective tape composed of a flexible resin is used, for example. Specifically, the protective component 19 includes a circular base and an adhesion layer (glue layer) disposed on the base. The base is composed of a resin such as polyolefin, polyvinyl chloride, or polyethylene terephthalate, and the adhesion layer is composed of an epoxy-based, acrylic, or rubber-based adhesive or the like. Furthermore, it is also possible to use an ultraviolet-curable resin cured by irradiation with ultraviolet rays for the adhesion layer. However, there is no limit on the material of the protective component 19 as long as the protective component 19 can protect the side of the front surface 11a of the wafer 11 and the plural devices 15. For example, the protective component 19 may be a high-rigidity substrate that is composed of silicon, glass, ceramic, or the like and is formed into a plate shape.

Figure 4B:
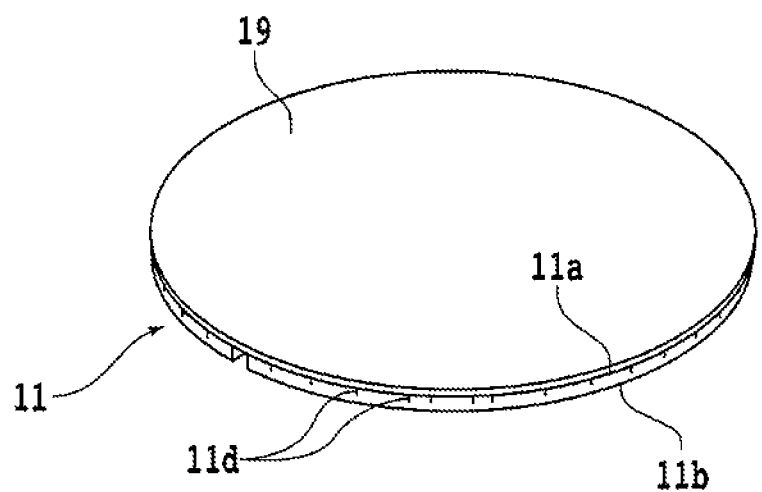
FIG. 4B is a perspective view depicting the wafer to which a protective component is stuck.

FIG. 4B is a perspective view depicting the wafer 11 to which the protective component 19 is stuck. By the protective component 19, the side of the front surface 11a of the wafer 11 and the plural devices 15 are protected in execution of later steps (grinding step, processing distortion removal step, and so forth).

Figure 5:
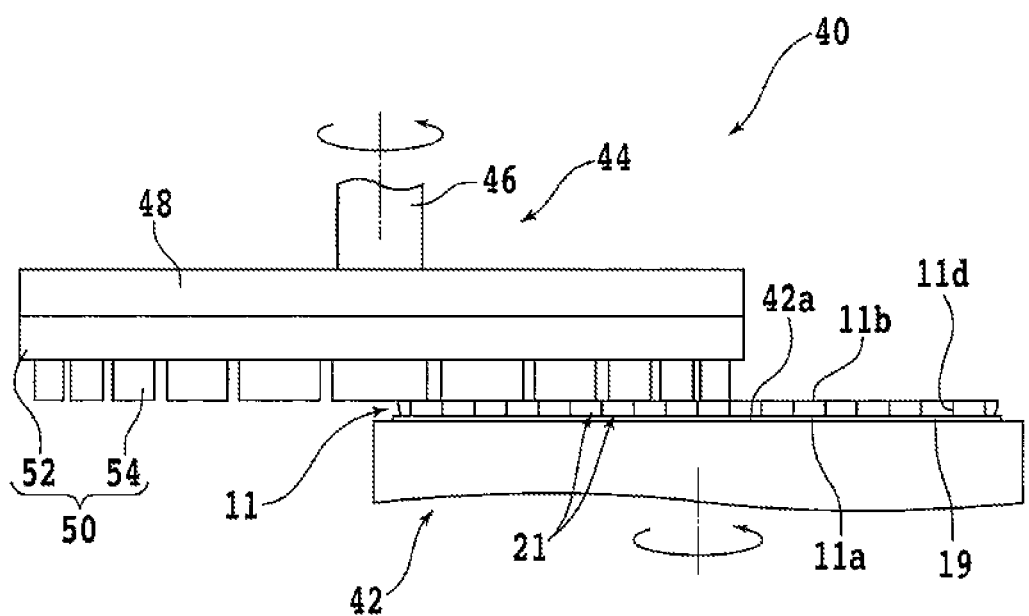
FIG. 5 is a front view depicting the wafer in a grinding step.

Next, by grinding the side of the back surface 11b of the wafer 11 and thinning the wafer 11, the cut grooves 11d are exposed in the back surface 11b and the wafer 11 is divided into plural device chips (grinding step). FIG. 5 is a front view depicting the wafer 11 in the grinding step. In the grinding step, the wafer 11 is ground by using a grinding apparatus 40. The grinding apparatus 40 includes a chuck table (holding table) 42 that holds the wafer 11 and a grinding unit 44 that grinds the wafer 11 held by the chuck table 42.

The upper surface of the chuck table 42 forms a holding surface 42a that holds the wafer 11. For example, the holding surface 42a is formed into a circular shape with a larger diameter than the wafer 11. However, the shape of the holding surface 42a is not limited and is set as appropriate according to the shape of the wafer 11. Furthermore, the holding surface 42a is connected to a suction source (not depicted) such as an ejector through a flow path (not depicted) formed inside the chuck table 42. There is no limit on the kind and structure of the chuck table that holds the wafer 11. For example, a chuck table that holds the wafer 11 by a mechanical method, electrical method, or the like may be used instead of the chuck table 42.

A movement mechanism (not depicted) and a rotation mechanism (not depicted) are connected to the chuck table 42. The movement mechanism moves the chuck table 42 along the horizontal direction. Furthermore, the rotation mechanism rotates the chuck table 42 around a rotation axis substantially parallel to the vertical direction.

The grinding unit 44 is disposed above the chuck table 42. The grinding unit 44 includes a circular cylindrical housing (not depicted) that moves in the vertical direction by a movement mechanism (raising-lowering mechanism, not depicted) and a circular cylindrical spindle 46 that becomes a rotation axis is housed in this housing.

The tip part (lower end part) of the spindle 46 protrudes downward from the lower end of the housing and a mount 48 that is composed of a metal or the like and has a circular disc shape is fixed to this tip part. A grinding wheel 50 with substantially the same diameter as the mount 48 is mounted on the lower surface side of the mount 48. The grinding wheel 50 includes a circular annular wheel base 52 composed of a metal such as stainless steel or aluminum. Furthermore, plural grinding abrasive stones 54 formed into a rectangular parallelepiped shape are fixed to the lower surface side of the wheel base 52 at substantially equal intervals along the outer circumference of the wheel base 52. The lower surfaces of these plural grinding abrasive stones 54 get contact with the wafer 11 and thereby the wafer 11 is ground.

A rotational drive source (not depicted) such as a motor is connected to the base end part (upper end part) of the spindle 46. The grinding wheel 50 rotates around a rotation axis substantially parallel to the vertical direction by a rotational force transmitted from this rotational drive source through the spindle 46 and the mount 48. Furthermore, a nozzle (not depicted) that supplies a grinding liquid such as purified water to the wafer 11 held by the chuck table 42 is disposed near the grinding unit 44. When the wafer 11 is ground by the plural grinding abrasive stones 54, the grinding liquid is supplied from the nozzle toward the wafer 11 and the plural grinding abrasive stones 54.

In the grinding step, first, the wafer 11 is held by the chuck table 42. Specifically, the wafer 11 is disposed on the chuck table 42 in such a manner that the side of the front surface 11a is opposed to the holding surface 42a and the side of the back surface 11b is exposed upward. When a negative pressure of the suction source is made to act on the holding surface 42a in this state, the wafer 11 is sucked and held by the chuck table 42.

Next, the chuck table 42 that holds the wafer 11 is moved to the lower side of the grinding unit 44. Then, the grinding wheel 50 is lowered toward the chuck table 42 while the chuck table 42 and the grinding wheel 50 are each rotated in a predetermined direction at a predetermined rotation speed. The lowering speed of the grinding wheel 50 at this time is adjusted to cause the plural grinding abrasive stones 54 to be pressed against the side of the back surface 11b of the wafer 11 with a proper force. When the lower surfaces of the plural grinding abrasive stones 54 that rotate get contact with the side of the back surface 11b of the wafer 11, the side of the back surface 11b of the wafer 11 is ground off. Thereby, grinding processing is executed for the wafer 11 and the wafer 11 becomes thinner. Then, when the wafer 11 has been thinned to a predetermined thickness (finished thickness), the grinding of the wafer 11 is completed. Furthermore, when the wafer 11 is ground by the plural grinding abrasive stones 54, the grinding liquid is supplied from the nozzle to the wafer 11 and the plural grinding abrasive stones 54. By this grinding liquid, the wafer 11 and the plural grinding abrasive stones 54 are cooled and dust generated due to the grinding of the wafer 11 (grinding dust) is washed off.

When the wafer 11 has been thinned until the thickness of the wafer 11 becomes the finished thickness, the cut grooves 11d formed along the streets 13 are exposed in the back surface 11b of the wafer 11 (see FIG. 5). Thereby, the wafer 11 is divided into plural device chips 21 each including the device 15.

Next, a gas in a plasma state is supplied to the side of the back surface 11b of the wafer 11 and processing distortion formed in the back surfaces and side parts of the plural device chips 21 is removed (processing distortion removal step).

When the laser processing step (see FIG. 2A) is executed, distortion of minute unevenness, cracks, and so forth (processing distortion) formed due to the irradiation with the laser beam 16 remains around the laser processed grooves 11c in some cases. For example, after execution of the laser processing step, the processing distortion remains in the side surfaces of the wafer 11 exposed inside the laser processed grooves 11c, the surroundings thereof, and so forth. Furthermore, when the cut groove forming step (see FIG. 3A) is executed, distortion of minute unevenness, cracks, and so forth (processing distortion) formed due to contact with the cutting blade 28 remains around the cut grooves 11d in some cases. For example, after execution of the cut groove forming step, the processing distortion remains in the side surfaces of the wafer 11 exposed inside the cut grooves 11d, the surroundings thereof, and so forth. Moreover, when the grinding step (see FIG. 5) is executed, distortion of minute unevenness, cracks, and so forth (processing distortion) formed due to contact with the plural grinding abrasive stones 54 remains on the side of the back surface 11b of the wafer 11 in some cases.

When the plural device chips 21 are manufactured by dividing the wafer 11 including the above-described processing distortion, the processing distortion remains in the device chips 21. Furthermore, a flexural strength (bending strength) of the device chips 21 lowers due to this processing distortion, so that the quality of the device chips 21 lowers. Thus, in the present embodiment, the processing distortion is removed by executing plasma treatment for the wafer 11 divided into the plural device chips 21.

Figure 6:
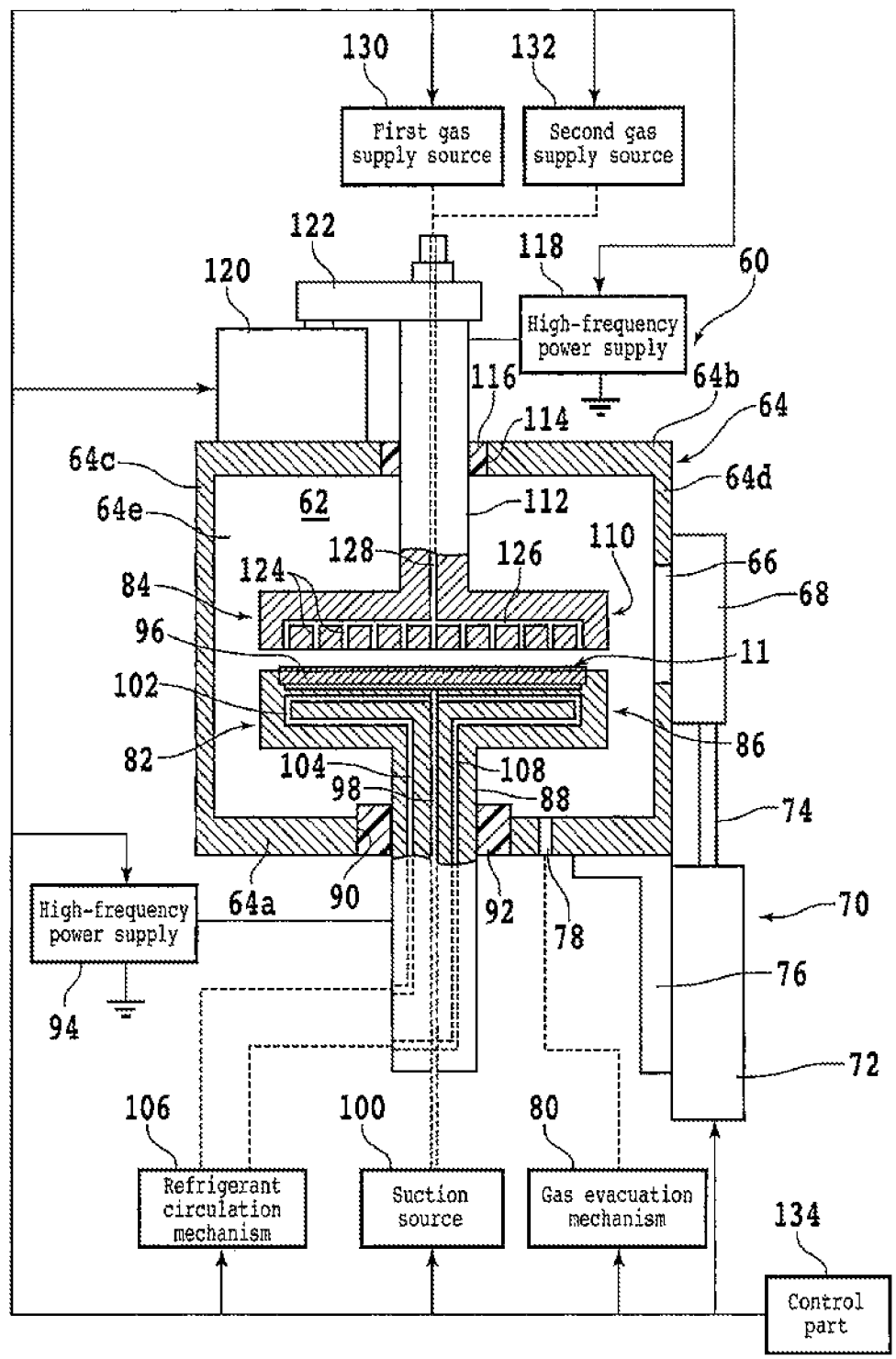
FIG. 6 is a schematic sectional view depicting a plasma treatment apparatus.

In the processing distortion removal step, the plasma treatment is executed for the wafer 11 by using a plasma treatment apparatus. FIG. 6 is a schematic sectional view depicting a plasma treatment apparatus 60.

The plasma treatment apparatus 60 includes a chamber 64 that forms a treatment space 62 in which plasma treatment is executed. The chamber 64 is formed into a rectangular parallelepiped shape including a bottom wall 64a, an upper wall 64b, a first sidewall 64c, a second sidewall 64d, a third sidewall 64e, and a fourth sidewall (not depicted). Furthermore, an opening 66 for carrying in and out the wafer 11 is made in the second sidewall 64d. A gate 68 that opens and closes the opening 66 is disposed outside the opening 66. The gate 68 is connected to an opening-closing mechanism 70 and the opening-closing mechanism 70 moves the gate 68 along the vertical direction (upward-downward direction). For example, the opening-closing mechanism 70 is formed of an air cylinder 72 having a piston rod 74. The upper end part of the piston rod 74 is joined to the lower part of the gate 68. In addition, the air cylinder 72 is fixed to the bottom wall 64a of the chamber 64 with the intermediary of a bracket 76. The gate 68 is lowered by the opening-closing mechanism 70 and the opening 66 is exposed. This makes it possible to carry in the wafer 11 to the treatment space 62 of the chamber 64 through the opening 66 or carry out the wafer 11 from the treatment space 62 of the chamber 64 through the opening 66.

Furthermore, a gas evacuation port 78 that connects the inside and outside of the chamber 64 is formed in the bottom wall 64a of the chamber 64. A gas evacuation mechanism 80 for reducing the pressure of the treatment space 62 is connected to the gas evacuation port 78. The gas evacuation mechanism 80 is formed of a vacuum pump, for example.

In the treatment space 62 of the chamber 64, a lower electrode 82 and an upper electrode 84 are disposed opposed to each other. The lower electrode 82 is composed of an electrically-conductive material and includes a holding part 86 with a circular disc shape and a support part 88 that protrudes downward from a central part of the lower surface of the holding part 86 and has a circular column shape. The support part 88 is inserted in an opening 90 formed in the bottom wall 64a of the chamber 64. An annular insulating component 92 is disposed between the bottom wall 64a and the support part 88 in the opening 90 and the chamber 64 is insulated from the lower electrode 82 by the insulating component 92. Furthermore, the lower electrode 82 is connected to a high-frequency power supply 94 outside the chamber 64.

A recessed part is formed on the upper surface side of the holding part 86 and a table 96 on which the wafer 11 is placed is disposed in this recessed part. The upper surface of the table 96 forms a holding surface that holds the wafer 11. Furthermore, a flow path (not depicted) is formed inside the table 96 and the upper surface of the table 96 is connected to a suction source 100 such as an ejector through this flow path and a flow path 98 formed inside the lower electrode 82.

Moreover, a cooling flow path 102 is formed inside the holding part 86. One end side of the cooling flow path 102 is connected to a refrigerant circulation mechanism 106 through a refrigerant introduction path 104 formed in the support part 88. Furthermore, the other end side of the cooling flow path 102 is connected to the refrigerant circulation mechanism 106 through a refrigerant discharge path 108 formed in the support part 88. When the refrigerant circulation mechanism 106 is actuated, a refrigerant flows in the refrigerant introduction path 104, the cooling flow path 102, and the refrigerant discharge path 108 sequentially and the lower electrode 82 is cooled.

The upper electrode 84 is composed of an electrically-conductive material and includes a gas ejection part 110 with a circular disc shape and a support part 112 that protrudes upward from a central part of the upper surface of the gas ejection part 110 and has a circular column shape. The support part 112 is inserted in an opening 114 formed in the upper wall 64b of the chamber 64. An annular insulating component 116 is disposed between the upper wall 64b and the support part 112 in the opening 114 and the chamber 64 is insulated from the upper electrode 84 by the insulating component 116. Furthermore, the upper electrode 84 is connected to a high-frequency power supply 118 outside the chamber 64. A support arm 122 joined to a raising-lowering mechanism 120 is mounted on the upper end part of the support part 112. The upper electrode 84 moves in the vertical direction (upward-downward direction) by the raising-lowering mechanism 120 and the support arm 122.

Plural ejection ports 124 are made on the lower surface side of the gas ejection part 110. These ejection ports 124 are connected to a first gas supply source 130 and a second gas supply source 132 through a flow path 126 formed inside the gas ejection part 110 and a flow path 128 formed inside the support part 112. The first gas supply source 130 and the second gas supply source 132 can supply gases of components different from each other to the flow path 128.

The respective constituent parts of the plasma treatment apparatus 60 (opening-closing mechanism 70, gas evacuation mechanism 80, high-frequency power supply 94, suction source 100, refrigerant circulation mechanism 106, high-frequency power supply 118, raising-lowering mechanism 120, first gas supply source 130, second gas supply source 132, and so forth) are connected to a control part (control unit, control apparatus) 134 that controls the plasma treatment apparatus 60. The control part 134 is configured by a computer or the like and controls operation of each of the constituent parts of the plasma treatment apparatus 60.

In the processing distortion removal step, first, the gate 68 of the plasma treatment apparatus 60 is lowered by the opening-closing mechanism 70 and the opening 66 is exposed. Then, by a conveying mechanism (not depicted), the wafer 11 is carried in to the treatment space 62 of the chamber 64 through the opening 66 and is disposed on the table 96. At this time, the wafer 11 is disposed in such a manner that the side of the back surface 11b is exposed toward the upper side (side of the upper electrode 84). At the time of the carrying-in of the wafer 11, it is preferable to raise the upper electrode 84 by the raising-lowering mechanism 120 and widen the interval between the lower electrode 82 and the upper electrode 84.

Next, a negative pressure of the suction source 100 is made to act on the upper surface of the table 96 and the wafer 11 is sucked and held by the table 96. Furthermore, the gate 68 is raised by the opening-closing mechanism 70 and the opening 66 is closed to hermetically seal the treatment space 62. Moreover, the height position of the upper electrode 84 is adjusted by the raising-lowering mechanism 120 in such a manner that the upper electrode 84 and the lower electrode 82 have a predetermined positional relation suitable for plasma treatment. Then, the gas evacuation mechanism 80 is actuated and the treatment space 62 is set to a reduced-pressure state (for example, at least 50 Pa and at most 300 Pa). If it becomes difficult to hold the wafer 11 on the table 96 by the negative pressure of the suction source 100 when the pressure of the treatment space 62 is reduced, the wafer 11 is held on the table 96 by an electrical force (typically electrostatic attraction) or the like. For example, plural electrodes are buried inside the table 96. By applying a predetermined voltage to these electrodes, a Coulomb force is made to act between the table 96 and the wafer 11 and the wafer 11 is caused to adhere to the table 96. That is, the table 96 functions as an electrostatic chuck table.

Then, a gas for etching (etching gas) is supplied to between the lower electrode 82 and the upper electrode 84 from the first gas supply source 130 through the flow path 128, the flow path 126, and the plural ejection ports 124. Furthermore, predetermined high-frequency power (for example, at least 1000 W and at most 3000 W) is given to the lower electrode 82 and the upper electrode 84. As a result, the gas that exists between the lower electrode 82 and the upper electrode 84 is turned to plasma and the gas in the plasma state is supplied to the side of the back surface 11$b$ of the wafer 11.

Figure 7:
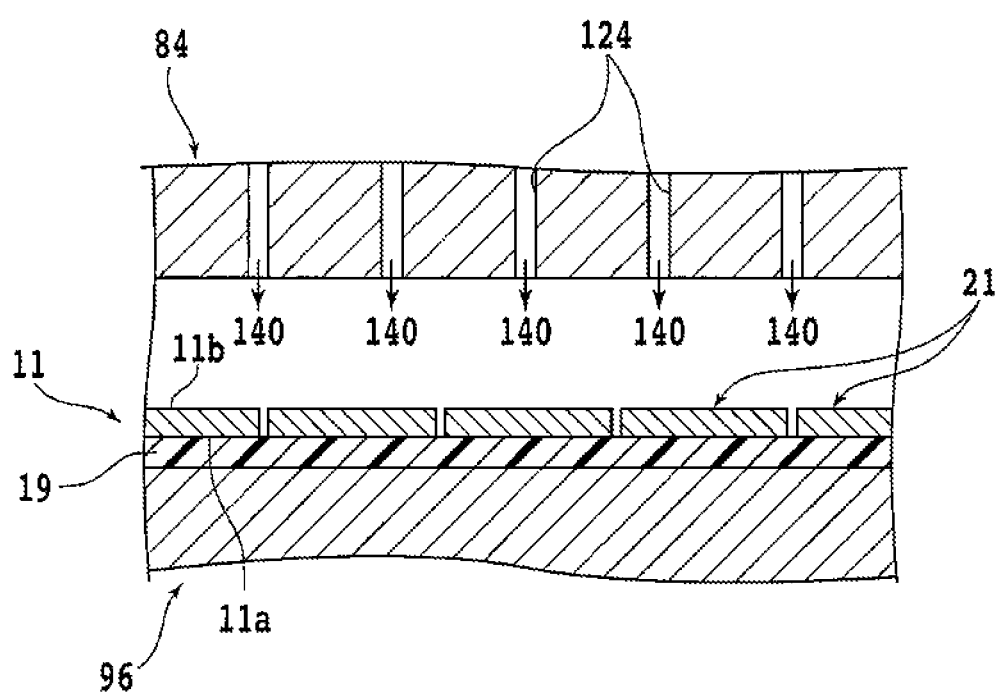
FIG. 7 is an enlarged sectional view depicting part of the wafer to which a gas in a plasma state is supplied.

FIG. 7 is an enlarged sectional view depicting part of the wafer 11 to which the gas in the plasma state is supplied. A gas 140 ejected from the plural ejection ports 124 becomes the plasma state including ions and radicals between the lower electrode 82 and the upper electrode 84. Then, the gas 140 in the plasma state is supplied to the side of the back surface 11$b$ of the wafer 11 divided into the plural device chips 21. As a result, the gas 140 in the plasma state acts on the wafer 11 and plasma etching is executed for the wafer 11. The component of the gas 140 is not limited and is selected as appropriate according to the material of the wafer 11. For example, when the wafer 11 is a silicon wafer, the gas 140 containing a fluorine-based gas of $CF_4$, $SF_6$, or the like can be used.

The gas 140 in the plasma state is applied to the back surface 11$b$ of the wafer 11 and enters the gaps between the adjacent device chips 21 (laser processed grooves 11$c$ and cut grooves 11$d$). Due to this, processing distortion formed on the side of the back surface 11$b$ of the wafer 11 (corresponding to the back surface side of the device chips 21) and processing distortion formed in the side parts of the wafer 11 exposed in the gaps between the adjacent device chips 21 (corresponding to the side parts of the device chips 21) are removed by the plasma etching.

Here, in the above-described laser processing step (see FIG. 2A), due to heat generated by the irradiation with the laser beam 16, processing distortion of unevenness and so forth due to thermal deformation is easily formed particularly around the laser processed grooves 11$c$. Furthermore, if the region in which this processing distortion due to the heat is formed (heat affected layer, heat distortion layer) remains in the wafer 11, the flexural strength of the device chips 21 is adversely affected.

Figure 8A:
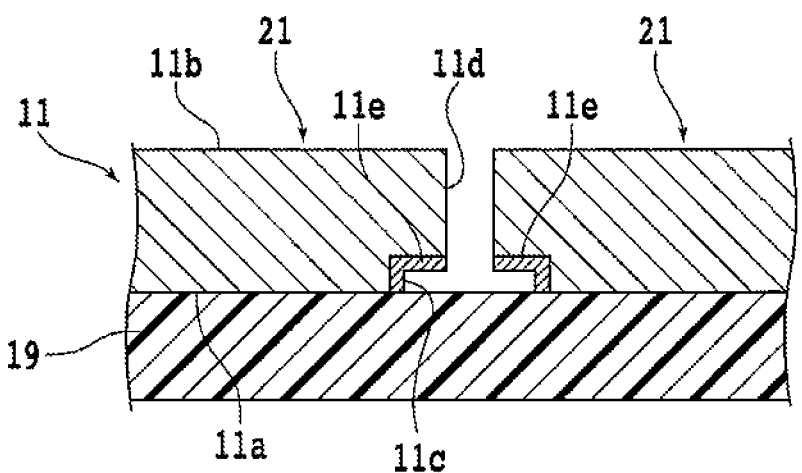
FIG. 8A is an enlarged sectional view depicting part of the wafer in which the laser processed grooves are formed.

FIG. 8A is an enlarged sectional view depicting part of the wafer 11 in which the laser processed grooves 11$c$ are formed. A heat affected layer (heat distortion layer) 11$e$ formed due to the irradiation with the laser beam 16 remains around the laser processed grooves 11$c$. In FIG. 8A, the state is depicted in which the heat affected layer 11$e$ remains along both side ends of the laser processed groove 11$c$ (pair of side surfaces of the wafer 11 exposed inside the laser processed groove 11$c$) and the bottom of the laser processed groove 11$c$. The heat affected layer 11$e$ is formed to a predetermined thickness (for example, 20 μm or smaller) according to the irradiation condition of the laser beam 16.

Figure 8B:
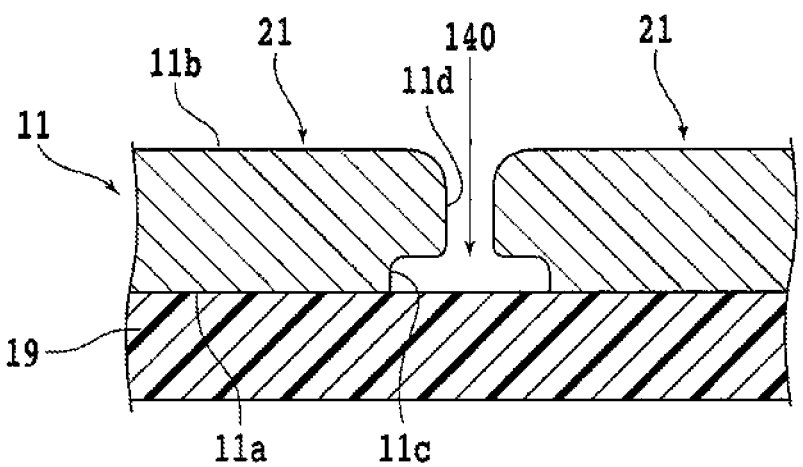
FIG. 8B is an enlarged sectional view depicting part of the wafer in which a heat affected layer around the laser processed grooves has been removed.

When the gas 140 in the plasma state is supplied to the wafer 11 in which the heat affected layers 11$e$ are formed, the gas 140 enters the cut grooves 11$d$ from the side of the back surface 11$b$ of the wafer 11 and reaches the laser processed grooves 11$c$. Then, plasma etching is executed for the heat affected layer 11$e$ formed around the laser processed grooves 11$c$ by the gas 140 and the heat affected layer 11$e$ is removed. FIG. 8B is an enlarged sectional view depicting part of the wafer 11 in which the heat affected layer 11$e$ around the laser processed grooves 11$c$ has been removed. Due to the removal of the heat affected layer 11$e$ by the supply of the gas 140 in the plasma state, the lowering of the flexural strength of the device chips 21 is suppressed.

After the execution of the above-described processing distortion removal step, a distortion layer (gettering layer) may be formed on the side of the back surface 11$b$ of the wafer 11 (distortion layer forming step). This distortion layer corresponds to a region in which more minute unevenness and cracks than the processing distortion formed in the wafer 11 in the above-described laser processing step and cut groove forming step are formed. It has been confirmed that, when the distortion layer exists on the side of the back surface 11$b$ of the wafer 11, the gettering effect by which metallic elements (copper and so forth) existing inside the wafer 11 are captured by the distortion layer is obtained. Thus, when the distortion layer is formed on the side of the back surface 11$b$ of the wafer 11, the metallic elements become less likely to move to the side of the front surface 11$a$ of the wafer 11, on which the plural devices 15 are formed, and operation failure (current leakage and so forth) of the device 15 attributed to the metallic elements becomes less likely to occur.

The plasma treatment apparatus 60 (see FIG. 6) can be used for the formation of the distortion layer. For example, the distortion layer is formed by making an inert gas be a plasma state by the plasma treatment apparatus 60 and supplying the inert gas to the side of the back surface 11$b$ of the wafer 11. Specifically, after removal of the processing distortion is completed in the processing distortion removal step, the supply of the etching gas from the first gas supply source 130 to the chamber 64 is stopped. Then, predetermined high-frequency power is given to the lower electrode 82 and the upper electrode 84 while the inert gas (for example, noble gas such as He or Ar) is supplied from the second gas supply source 132 to the chamber 64. Thereby, the inert gas is turned to plasma between the lower electrode 82 and the upper electrode 84 and the inert gas in the plasma state is applied to the back surface 11$b$ of the wafer 11. As a result, the back surface 11$b$ of the wafer 11 is sputtered and minute unevenness or cracks (distortion) are formed in the back surface 11$b$. The region in which this distortion is formed (distortion layer) functions as a gettering layer that captures metallic elements contained inside the wafer 11.

The thickness of the distortion layer formed by the plasma treatment using the inert gas is extremely small. For example, the thickness of the distortion layer is at most 1/10 of the thickness of the processing distortion formed in the wafer 11 in the laser processing step and the cut groove forming step. Thus, the influence given to the flexural strength of the device chips 21 by the distortion layer is small.

As described above, in the processing method of a wafer according to the present embodiment, the heat affected layer 11$e$ formed around the laser processed grooves 11$c$ is removed by supplying the gas in the plasma state to the wafer 11 divided into the plural device chips 21 through the formation of the laser processed grooves 11c by the irradiation with the laser beam 16. This can prevent the heat affected layer 11e from remaining in the device chips 21 and suppress the lowering of the flexural strength of the device chips 21.

In the above-described embodiment, the example in which the laser processed grooves 11c and the cut grooves 11d are formed in the wafer 11 is described (see FIG. 2A and FIG. 3A). However, in the laser processing step, the laser processed grooves 11c with a depth that exceeds the finished thickness of the wafer 11 may be formed along the streets 13 by irradiation with the laser beam 16. When the wafer 11 in which the laser processed grooves 11c with the depth that exceeds the finished thickness of the wafer 11 are formed is thinned until the thickness of the wafer 11 becomes the finished thickness (grinding step), the laser processed grooves 11c are exposed on the side of the back surface 11b of the wafer 11. Thereby, the wafer 11 is divided into the plural device chips 21. When the depth of the laser processed grooves 11c is set larger than the finished thickness of the wafer 11 as described above, the step of cutting the wafer 11 by the cutting blade 28 (cut groove forming step) can be omitted. Due to this, preparation and operation of the cutting apparatus 20 become unnecessary. In addition, the number of steps is reduced.

Moreover, in the laser processing step, laser processed grooves that reach the back surface 11b from the front surface 11a of the wafer 11 may be formed along the streets 13 by irradiation with the laser beam 16. In this case, the wafer 11 is divided along the streets 13 by the irradiation with the laser beam 16.

Figure 9A:
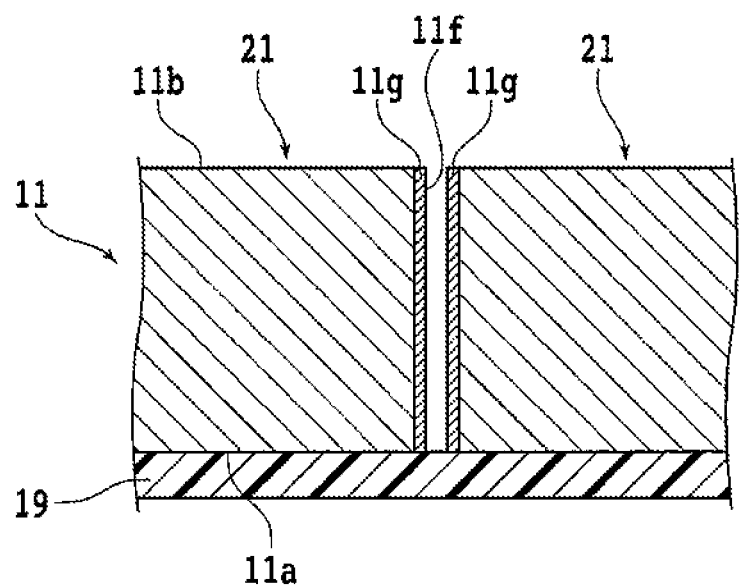
FIG. 9A is an enlarged sectional view depicting part of the wafer in which laser dividing grooves are formed.

FIG. 9A is an enlarged sectional view depicting part of the wafer 11 in which laser processed grooves (laser dividing grooves) 11f that reach the back surface 11b from the front surface 11a of the wafer 11 are formed. When the laser processed grooves 11f are formed along the streets 13 by irradiation with the laser beam 16, the wafer 11 is divided along the streets 13. That is, the wafer 11 is divided into the plural device chips 21 in the laser processing step. When the laser processed grooves 11f are formed in the laser processing step, formation of the cut grooves 11d becomes unnecessary and the cut groove forming step can be omitted. Furthermore, the grinding step is executed in the state in which the wafer 11 has been divided into the plural device chips 21, and the back surface side of each of the plural device chips 21 is ground. However, the grinding step can be omitted if the thickness of the device chips 21 obtained in the laser processing step already falls within a desired range.

Figure 9B:
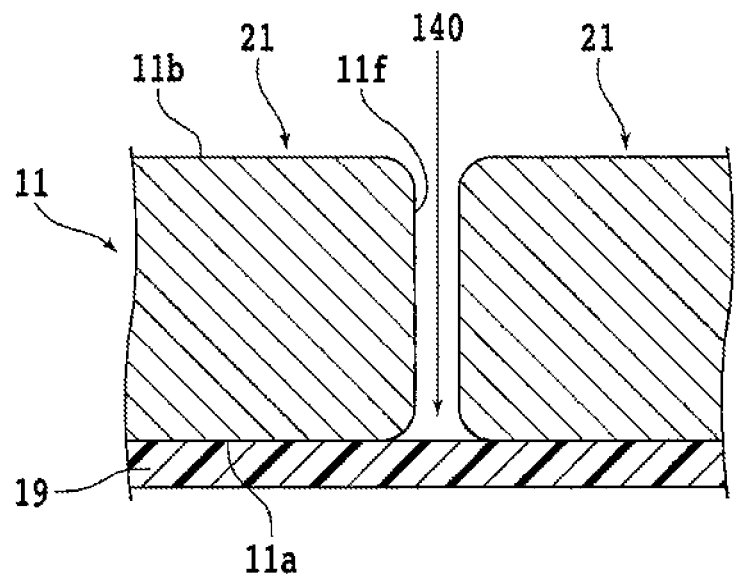
FIG. 9B is an enlarged sectional view depicting part of the wafer in which a heat affected layer around the laser dividing grooves has been removed.

When the laser processed grooves 11f are formed by irradiation with the laser beam 16, the heat affected layer (heat distortion layer) 11g is formed around the laser processed grooves 11f. In FIG. 9A, the state is depicted in which the heat affected layer 11g remains along both side ends of the laser processed groove 11f (pair of side surfaces of the wafer 11 exposed inside the laser processed groove 11f). When the gas 140 in a plasma state is supplied to the side of the back surface 11b of the wafer 11 in which the heat affected layers 11g are formed by using the plasma treatment apparatus 60 (see FIG. 6), the gas 140 in the plasma state enters the laser processed grooves 11f. Due to this, the heat affected layer 11g formed around the laser processed grooves 11f is removed (heat affected layer removal step). FIG. 9B is an enlarged sectional view depicting part of the wafer 11 in which the heat affected layer 11g around the laser processed grooves 11f has been removed.

In some cases, it is difficult to form the laser processed grooves 11c with the depth that exceeds the finished thickness of the wafer 11 or the laser processed grooves 11f that reach the back surface 11b from the front surface 11a of the wafer 11 by one time of irradiation with the laser beam 16. In this case, the laser processed grooves 11c or 11f are formed by executing irradiation with the laser beam 16 plural times along each street 13.

Furthermore, in the above-described embodiment, the plasma treatment apparatus 60 (see FIG. 6) that turns a gas supplied to the chamber 64 to plasma inside the chamber 64 is described. However, the plasma treatment apparatus 60 may supply a gas turned to plasma outside the chamber 64 to the inside of the chamber 64. It has been confirmed that the gas enters gaps formed in the wafer 11 (laser processed grooves 11c or 11f, cut grooves 11d, and so forth) more readily when the gas turned to plasma outside the chamber 64 is introduced into the chamber 64 and is supplied to the wafer 11. It is inferred that this is attributed to that, when the gas in the plasma state is introduced to the inside of the chamber 64 from the outside through a pipe, ions contained in the gas are excluded due to adsorption to the inner wall of the pipe and so forth and the gas with a high ratio of radicals is supplied to the wafer 11. For this reason, when the gas turned to plasma outside the chamber 64 is supplied to the wafer 11, the gas in the plasma state travels more readily inside the laser processed grooves 11c or 11f and the cut grooves 11d toward the side of the front surface 11a of the wafer 11. This facilitates removal of the processing distortion formed on the side of the front surface 11a of the wafer 11 (for example, heat affected layer 11e depicted in FIG. 8A and so forth).

Besides, structures, methods, and so forth according to the above-described embodiment can be implemented with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer having, on a front surface side, a functional layer that forms a plurality of devices disposed in a plurality of regions marked out by a plurality of streets, the processing method comprising:

a laser processing step of forming laser processed grooves along the streets while removing the functional layer along the streets by irradiating the front surface side of the wafer with a laser beam having absorbability with respect to the wafer along the streets;

a cut groove forming step of forming cut grooves with a depth that exceeds finished thickness of the wafer inside the laser processed grooves along the streets by cutting the front surface side of the wafer along the streets by a cutting blade thinner than width of the laser processed grooves;

a protective component sticking step of sticking a protective component to the front surface side of the wafer after execution of the cut groove forming step;

a grinding step of causing the cut grooves to be exposed on a back surface side of the wafer to divide the wafer into a plurality of device chips by holding the wafer by a chuck table of a grinding apparatus with intermediary of the protective component and grinding the back surface side of the wafer to thin the wafer until thickness of the wafer becomes the finished thickness; and a processing distortion removal step of supplying a gas in a plasma state to the back surface side of the wafer from the back surface side of the wafer and removing processing distortion formed in the back surface side and side parts of the plurality of device chips, wherein a heat affected layer formed around the laser processed grooves is removed in the processing distortion removal step.

2. A processing method of a wafer having, on a front surface side, a functional layer that forms a plurality of devices disposed in a plurality of regions marked out by a plurality of streets, the processing method comprising:

a laser processing step of forming laser processed grooves with a depth that exceeds finished thickness of the wafer along the streets while removing the functional layer along the streets by irradiating the front surface side of the wafer with a laser beam having absorbability with respect to the wafer along the streets;

a protective component sticking step of sticking a protective component to the front surface side of the wafer after execution of the laser processing step;

a grinding step of causing the laser processed grooves to be exposed on a back surface side of the wafer to divide the wafer into a plurality of device chips by holding the wafer by a chuck table of a grinding apparatus with intermediary of the protective component and grinding the back surface side of the wafer to thin the wafer until thickness of the wafer becomes the finished thickness; and a processing distortion removal step of supplying a gas in a plasma state to the back surface side of the wafer from the back surface side of the wafer and removing processing distortion formed in the back surface side and side parts of the plurality of device chips, wherein a heat affected layer formed around the laser processed grooves is removed in the processing distortion removal step.

3. A processing method of a wafer having, on a front surface side, a functional layer that forms a plurality of devices disposed in a plurality of regions marked out by a plurality of streets, the processing method comprising:

a laser processing step of forming laser processed grooves along the streets to divide the wafer into a plurality of device chips while removing the functional layer along the streets by executing irradiation with a laser beam having absorbability with respect to the wafer along the streets;

a protective component sticking step of sticking a protective component to the front surface side of the wafer after execution of the laser processing step; and a heat affected layer removal step of supplying a gas in a plasma state to a back surface side of the wafer from the back surface side of the wafer and removing a heat affected layer formed around the laser processed grooves after execution of the protective component sticking step.

* * * * *